United States Patent
Nirschl et al.

(10) Patent No.: US 7,474,555 B2
(45) Date of Patent: Jan. 6, 2009

(54) INTEGRATED CIRCUIT INCLUDING RESISTIVITY CHANGING MATERIAL ELEMENT

(76) Inventors: Thomas Nirschl, 17A Lamoille St., Essex Junction, VT (US) 05452; Thomas Happ, 31 Storm St., 2, Tarrytown, NY (US) 10591

( * ) Notice: Subject to any disclaimer, the term of this patent is extended or adjusted under 35 U.S.C. 154(b) by 198 days.

(21) Appl. No.: 11/378,201

(22) Filed: Mar. 17, 2006

(65) Prior Publication Data

US 2007/0217318 A1    Sep. 20, 2007

(51) Int. Cl.
*G11C 11/00* (2006.01)

(52) U.S. Cl. .......................... 365/163; 365/46; 365/158; 365/55; 365/100

(58) Field of Classification Search ............... 365/46, 365/148, 158, 55, 97, 100, 131, 163
See application file for complete search history.

(56) References Cited

U.S. PATENT DOCUMENTS

| | | | |
|---|---|---|---|
| 6,724,672 B2 | 4/2004 | Nirschl | |
| 2002/0097598 A1 * | 7/2002 | Hoenigschmid | 365/97 |
| 2005/0105327 A1 * | 5/2005 | Nazarian | 365/158 |
| 2005/0180189 A1 | 8/2005 | Happ et al. | |
| 2005/0212024 A1 | 9/2005 | Happ | |

FOREIGN PATENT DOCUMENTS

WO    WO 2005117026 A1 *  12/2005

OTHER PUBLICATIONS

"Can NROM, a 2 Bit, Trapping Storage NVM Cell, Give a Real Challenge to Floating Gate Cells?" Boaz Eitan, Paolo Pavan, Ilian Bloom, Efraim Aloni, Aviv Frommer and David Finzi, Extended Abstracts of the 1999 International Ceonference on Solid State Devices and Materials, Tokyo, 1999, pp. 522-524.
"Highly Reliable 50 nm Contact Cell Technology for 256Mb PRAM", S.J. Ahn et al., 2005 Symposium on VLSI Technology Digest of Technical Papers, pp. 98-99.
"Ovonic Unified Memory—A High-performance Nonvolatile Memory Technology for Stand Alone Memory and Embedded Applications", Manzur Gill, Tyler Lowrey and John Park, 2003, 4 pgs.

* cited by examiner

*Primary Examiner*—Hoai V Ho
*Assistant Examiner*—Fernando N Hidalgo
(74) *Attorney, Agent, or Firm*—Dicke, Billig, Czaja, PLLC

(57) ABSTRACT

A phase change memory cell includes a MOS select transistor having a gate coupled to a word line, and a source and drain region coupled between first and second bit lines, respectively. A first phase change element is coupled between the first bit line and the source region of the MOS select transistor. A method of reading a selected cell in the array is provided by evaluating a body effect impact of a state of the phase change element associated with the selected cell on a MOS select transistor.

19 Claims, 7 Drawing Sheets

INTEGRATED CIRCUIT INCLUDING RESISTIVITY CHANGING MATERIAL ELEMENT

FIELD OF INVENTION

The present invention relates generally to a memory cell array architecture and methods of addressing cells in such an architecture, and more particularly to a pseudo virtual ground architecture for a phase change memory device.

BACKGROUND OF THE INVENTION

In the case of conventional memory devices, in particular conventional semiconductor memory devices, it is sometimes common to differentiate between functional memory devices (e.g., PLAs, PALs, etc.) and table memory devices. For example, some table memory devices include ROM devices (Read Only Memory) such as PROMs, EPROMs, EEPROMs, flash memories, etc., and RAM devices (Random Access Memory or read-write memory) such as DRAMs and SRAMs.

In the case of SRAMs (Static Random Access Memory), individual memory cells consist of several, for example, six, transistors configured as a cross-coupled latch. In the case of DRAMs (Dynamic Random Access Memory), generally only one single, correspondingly controlled capacitive element (e.g., the gate-source capacitance of a MOSFET) is employed, wherein charge may be stored in the capacitance. The charge in a DRAM, however, remains for only a short time, and a periodic refresh must be performed, to maintain a data state. In contrast to the DRAM, the SRAM requires no refresh, and the data stored in the memory cell remains stored as long as an appropriate supply voltage is fed to the SRAM. Both SRAMs and DRAMs are considered volatile memories, wherein a data state is only retained as long as power is supplied thereto.

In contrast to volatile memory, non-volatile memory devices (NVMs), e.g., EPROMs, EEPROMs, and flash memories, exhibit a different property, wherein the stored data is retained even when the supply voltage associated therewith is switched off. This type of memory has several advantages for various types of mobile communications devices such as, for example, in an electronic rolodex on cell phones, wherein the data therein is retained even when the cell phone is turned off.

One type of non-volatile memory that has recently been developed is called resistive or resistively switched memory devices. In such a resistive memory, a memory material positioned between two appropriate electrodes (i.e., an anode and a cathode) is placed, by appropriate switching processes, in a more or less conductive state, wherein the more conductive state corresponds to a logic "1", and the less conductive state corresponds to a logic "0", for example (or vice versa). Suitable resistive memories can be, for example, perovskite memory, as described in W. W. Zhuamg et al, "Novell Colossal Magnetoresistive Thin Film Nonvolatile Resistance Random Access Memory (RRAM)", IEDM 2002, resistive switching in binary oxides (OxRAM), as, for example, described in I. G. Baek et.al., "Multi-layer crosspoint binary oxide resistive memory (OxRAM) for post-NAND storage application", IEDM 2005, or phase change memory.

In the case of phase change memory, an appropriate chalcogenide compound (e.g., a GeSbTe or an AgInSbTe compound) may, for instance, be used as the active material that is positioned between the two corresponding electrodes. The chalcogenide compound material can be placed in an amorphous, i.e., relatively weakly conductive, or a crystalline, i.e., relatively strongly conductive state by means of appropriate switching processes, and thus behaves like a variable resistance element, which as highlighted above, may be exploited as differing data states.

In order to achieve a change in the phase change material from an amorphous state to a crystalline state, an appropriate heating current can be applied to the electrodes, wherein the current heats the phase change material beyond the crystallization temperature thereof. This operation is sometimes called a SET operation. Similarly, a change of state from a crystalline state to an amorphous state may be achieved by application of an appropriate heating current pulse, wherein the phase change material is heated beyond the melting temperature thereof, and the amorphous state is obtained during the rapid cooling process thereof. This operation is sometimes called a RESET operation. The combination of SET and RESET operations is one means by which data can be written to a phase change memory cell.

Conventionally, phase change memory devices were organized in one or more arrays of phase change cells in a core area of the device, wherein each phase change memory cell was composed of a phase change memory element coupled to a selection switching device. One conventional arrangement is illustrated in FIG. 1, wherein a phase change element 10 is coupled between a bit line 12 and a bipolar select transistor 14. A word line 16 is coupled to the base terminal of the transistor 14. By properly addressing the bit line 12 and word line 16 associated therewith, data may be written thereto and read therefrom. An array of phase change memory cells configured in the manner described above is sometimes called a NOR type memory array.

It is often desirable to increase the density in a memory, that is, to increase the amount of data that can be stored within a given area. In some instances, attempts have been made to increase memory density by storing multiple bits of data within a single memory cell. Such a solution in phase change memory cells, however, disadvantageously results in an increase in power consumption when reading data from or writing data to the cell. Consequently, another solution to increase the memory density is to reduce the physical size of an individual memory cell.

One attempt to reduce the size of an individual phase change memory cell employed a cross-point array-like structure, where a bit line and a word line are used to select a phase change cell using an additional two-port element that was similar to a diode. This solution, however, suffers from a variety of disadvantages such a signal integrity, and difficulties arise in the integration of the diode-like structure into a standard process flow. Therefore there is a need in the art for improved memory cell architectures for phase change memory devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed to a phase change memory cell array architecture and a method of addressing such an architecture. In one embodiment of the invention, a phase change memory array is configured in a pseudo virtual ground architecture and comprises a plurality of MOS select transistors coupled together in series to form a transistor string. Each of the MOS select transistors in the string has a gate terminal that is coupled to an individual, unique word line. The MOS transistors can be planar transistors or 3D structures, such as FinFETs, tri-gate, or multi-gate transistors. The array further comprises a plurality of phase change elements that are coupled between a unique bit line and a source region of a respective MOS select transistor in the transistor string. Data associated with a respective phase change element is sensed in the architecture of the invention by sensing an impact of a resistance condition of the phase change element on the threshold voltage of the MOS select transistor.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1:
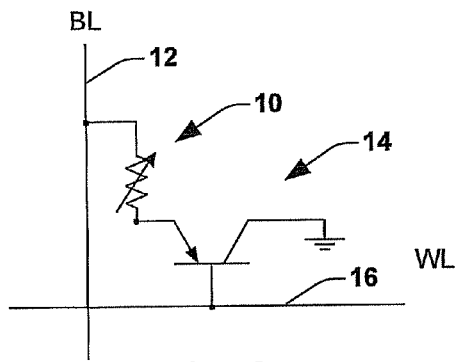
FIG. 1 is a prior art schematic diagram illustrating a conventional phase change memory cell in a NOR-type architecture.
Figure 2:
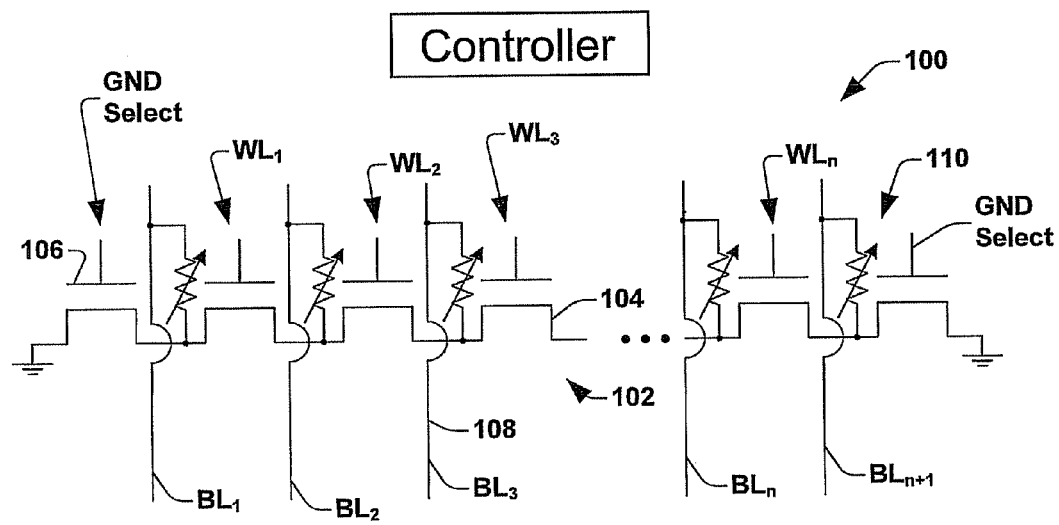
FIG. 2 is a schematic diagram illustrating a portion of a phase change memory array configured in a pseudo virtual ground array architecture according to one embodiment of the invention.

One or more implementations of the present invention will now be described with reference to the attached drawings, wherein like reference numerals are used to refer to like elements throughout. The invention relates to a pseudo virtual ground memory architecture and a method of addressing the same. Turning to FIG. 2, a schematic diagram is provided illustrating one page or row 100 of a phase change memory architecture according to the invention. The row 100 of memory cells comprises a transistor string 102 of a plurality of series-connected MOS select transistors 104. In the illustrated embodiment, the MOS select transistors 104 are coupled to one another in series by sharing a source/drain diffusion in a semiconductor body. In the illustrated embodiment example, each end of the transistor string 102 is selectively coupled to a low potential such as circuit ground through a ground select transistor 106.

Still referring to FIG. 2, each of the MOS select transistors 104 have a unique bit line 108 associated therewith and is coupled thereto through an associated phase change element 110. In FIG. 2, the phase change elements are illustrated as variable resistors for ease of illustration, since such elements are configured to change a conductance thereof that is indicative of a state of the memory cell. As highlighted supra, based upon a current passed through the phase change element, the element can be altered between polycrystalline and amorphous states.

In contrast to conventional virtual ground memory architectures, where all the gate terminals of memory devices along a given row are coupled to a common word line, the pseudo virtual ground architecture of the invention has a gate terminal of each of the MOS select transistors 104 coupled to a unique word line. Accordingly, in one example the gate of MOS select transistor #1 is coupled to $WL_1$, the gate of MOS select transistor #2 is coupled to $WL_2$, and so on. As will be appreciated infra, the pseudo virtual ground architecture facilitates a reading of a phase change memory cell by exploiting the body effect of the associated MOS select transistor.

As is known for a conventional MOS type transistor device, the body portion (sometimes the substrate) of the transistor is often coupled to the source terminal of the transistor, which results in the pn junction between the substrate and the induced channel having a constant reverse bias. In such instances, the body does not impact device operation and can be ignored. However, in accordance with the invention, the body of each MOS select transistor in the transistor string is not coupled to the source terminal, but is instead coupled to the most negative supply voltage or some other suitable potential in the circuit to maintain the reverse bias condition of the substrate-to-channel junction. The resulting reverse bias voltage between the source and body ($V_{SB}$) does have an impact on transistor device operation and this "body effect" is exploited by the invention. More particularly, since $V_{SB}$ impacts the channel depth in the respective MOS select transistor, increasing $V_{SB}$ depletes the channel of charge carriers while decreasing $V_{SB}$ increases such carriers. Consequently, the body terminal can be thought of as acting like a second gate for the transistor and consequently impacts the threshold voltage ($V_t$) of the transistor device. The relationship between $V_{SB}$ and $V_t$ can be characterized as follows:

$$V_t = K + y(V_{SB})^{1/2} \quad \text{(equation 1)},$$

wherein K is a constant, and y is a device parameter that depends upon substrate doping and other device parameters. However, as can be seen above from equation (1), the body effect can alter the threshold voltage characteristics of the MOS select transistor.

The present invention exploits the body effect as described above by employing the resistance of the respective phase change element to alter the effective $V_{SB}$ of the associated MOS select transistor. Therefore in one state, the phase change element is less resistive, causing a smaller $V_{SB}$ and a lower $V_t$ (e.g., $V_{t1}$), while in another state is more resistive, causing a larger $V_{SB}$ and a larger $V_t$ (e.g., $V_{t2}$). As can be seen from equation (1), by altering the state of the phase change element, the threshold voltage ($V_t$) of the MOS select transistor is altered. Consequently, by placing a read voltage on the gate of the MOS select transistor that is greater than $V_{t1}$ and less than $V_{t2}$, a data state of the phase memory cell can be ascertained by evaluating the current of the transistor.

Figure 3A:
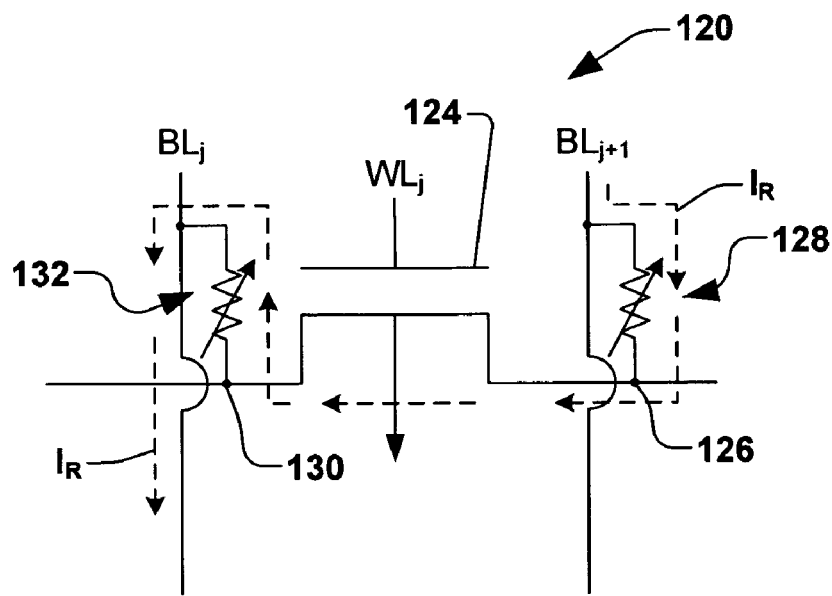
FIG. 3A is a schematic diagram illustrating a portion of a phase change memory array according to another embodiment of the invention in a read operation.
Figure 3B:
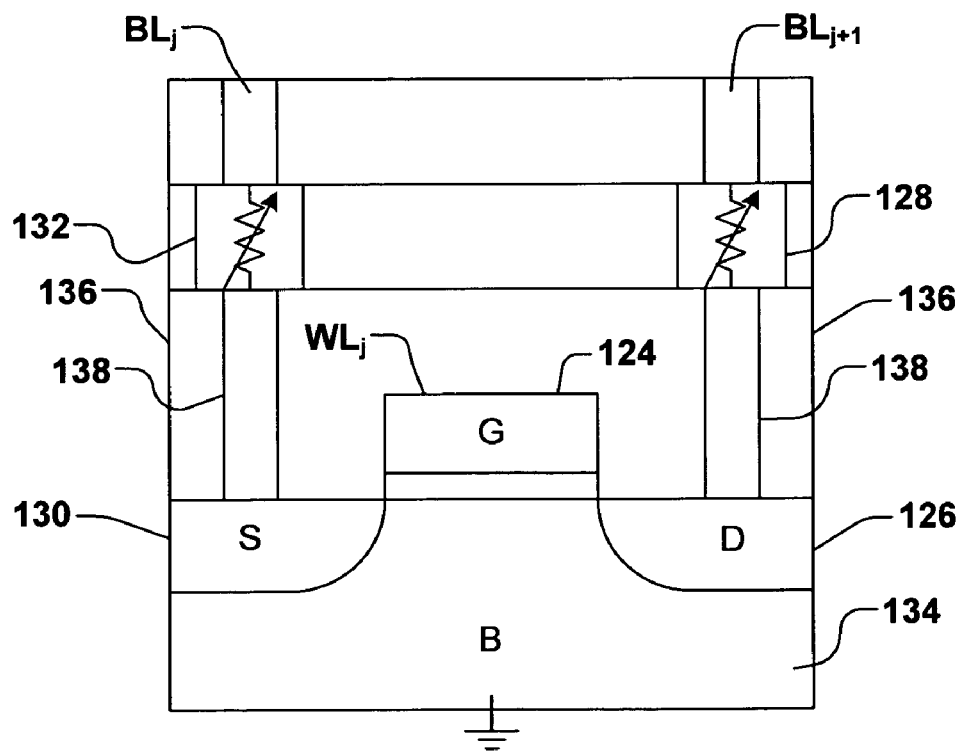
FIG. 3B is a fragmentary cross section of a portion of a phase change memory array in a pseudo virtual ground architecture according to another embodiment of the invention.

Turning to FIGS. 3A and 3B, a phase change memory cell is illustrated at reference numeral 120 according to one example embodiment of the invention. The $j^{th}$ MOS select transistor 122 in a row or page has a gate terminal 124 coupled to a unique word line $WL_j$, a drain terminal 126 coupled to a neighboring bit line $BL_{j+1}$ via a neighboring phase change element 128, and a source terminal 130 coupled to the cell's associated bit line $BL_j$ through its respective phase change element 132. As illustrated in the example of FIG. 3B, the MOS select transistor is formed on and in a semiconductor body 134, and is coupled to the phase change elements 128, 132 in an upper dielectric layer 136 through contacts 138.

Figure 4:
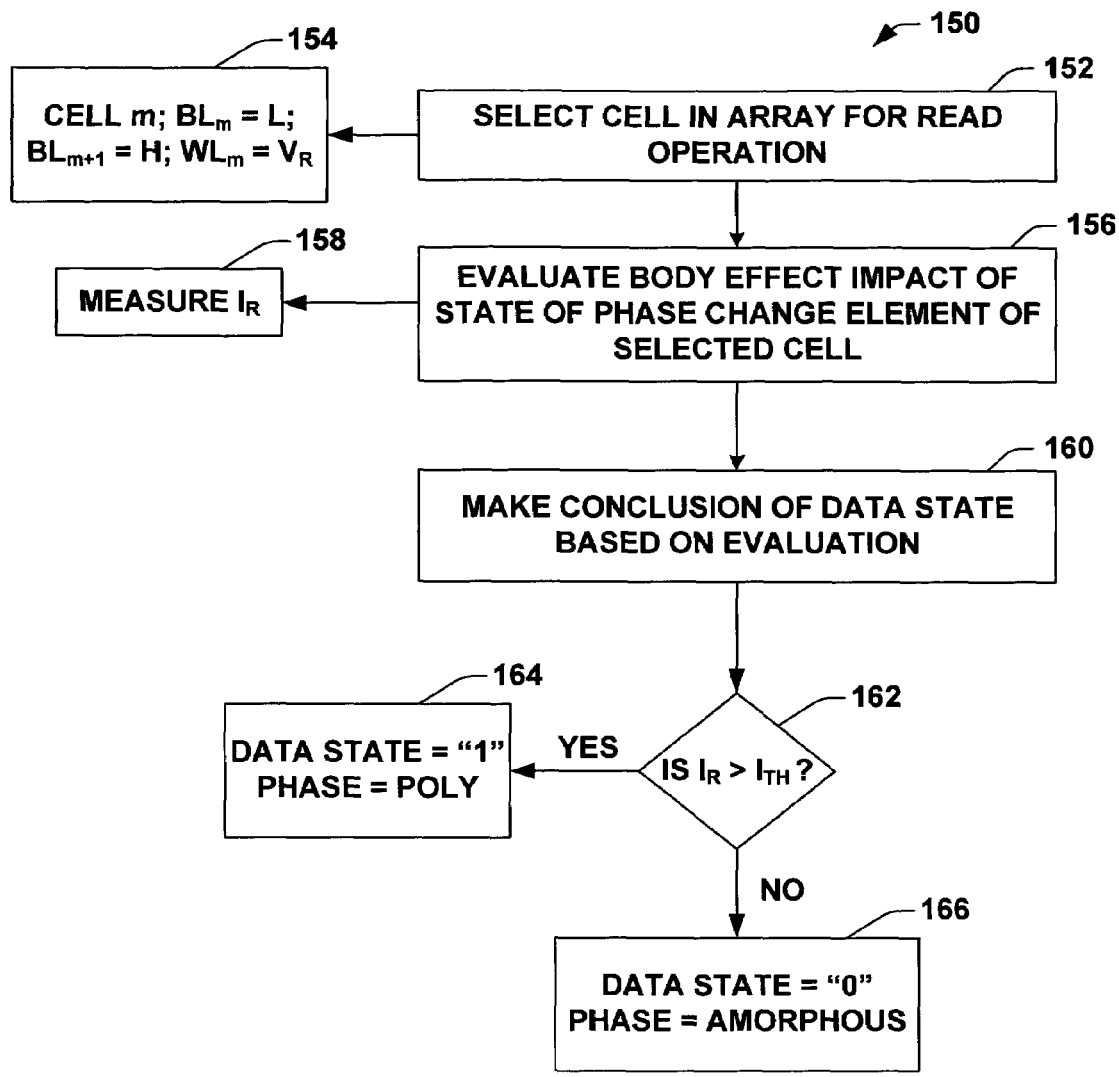
FIG. 4 is a flow chart diagram illustrating a method of addressing a pseudo virtual ground phase change memory array in a read context according to yet another embodiment of the invention.

A method of reading a state of the phase change memory cell 120 of FIGS. 3A and 3B in the pseudo virtual ground architecture 100 of FIG. 2 is illustrated in the flow chart of FIG. 4 at reference numeral 150. While the method 150 and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated actions may be required to implement a methodology in accordance with the invention.

Initially, at 152 a phase change memory cell is selected to read data therefrom. In one example embodiment, a decoder circuit (not shown) may be employed to properly bias the appropriate word line and bit lines for the selected cell. For example, as illustrated at 154 of FIG. 4, if memory cell "m" is selected within a given row (such as the row illustrated in FIG. 2), the $m^{th}$ word line ($WL_m$) is coupled to a read voltage level $V_R$ (e.g., a value greater than $V_{t1}$ and less than $V_{t2}$), the bit line associated with the source terminal of the $m^{th}$ MOS select transistor ($BL_m$) is coupled to a low potential (L), and the bit line associated with the drain terminal of the $m^{th}$ MOS select transistor ($BL_{m+1}$) is coupled to a high potential (H). In such a bias arrangement, current ($I_R$) will flow through the selected MOS transistor as a function of the cell threshold voltage, as illustrated in FIG. 3A.

At 156 of FIG. 4 the body effect impact of a state of the phase change element associated with the $m^{th}$ cell is evaluated, for example, by measuring the current through the MOS transistor at 158. In one example, the current $I_R$ is detected with a sense amplifier circuit, however, any manner of evaluating the body effect impact may be employed and is contemplated by the present invention. Based on the measured current $I_R$, for example, a conclusion is made of the data state of the selected cell based on the evaluation at 160 of FIG. 4. In one example embodiment, the conclusion is made by comparing the measured current $I_R$ to a threshold current $I_{TH}$ at 162, wherein the level of the threshold current is selected to differentiate between actual conduction of the MOS transistor and transistor leakage.

If the measured current $I_R$ is greater than the threshold $I_{TH}$ at 162, then the body effect of the phase change element is small and $V_t = V_{t1}$. Consequently, the applied read voltage $V_R$ at the gate is greater than $V_{t1}$, and the MOS select transistor conducts an appreciable amount of current. Consequently, the phase change element is in the polycrystalline state, and the data read is a "1" at 164, for example. Conversely, if the measured current $I_R$ is less than the threshold $I_{TH}$ at 162, then the body effect of the phase change element is significant, and $V_t = V_{t2}$. Consequently, the applied read voltage $V_R$ at the MOS select transistor gate is less than $V_{t2}$, and the transistor does not appreciably conduct (e.g., any detectable current is attributable to leakage). Therefore the phase change element is in the amorphous state, and the data read is a "0" at 166, for example.

Referring briefly to FIGS. 2 and 3A, it should be noted that, in one example, the MOS select transistors 104 are symmetrical devices, meaning that the source and drain regions/terminals associated therewith are interchangeable. In another embodiment, the select transistors 104 are asymmetrical devices, which can be used to facilitate the distinction between the left and the right phase change element during read. Accordingly, in an another embodiment of the invention, the phase change element associated with the bit line to the right of a given MOS select transistor can be the bit line uniquely associated with the MOS select transistor by biasing the bit lines in the opposite fashion. For example, in FIG. 3A, instead of $BL_{j+1}$=H and $BL_j$=L with phase change element 132 being the read element, the bit lines may be biased in the opposite fashion, wherein $BL_{j+1}$=L and $BL_j$=H with the phase change element 128 being the read element. Further, as can be appreciated in FIG. 2, the last MOS select transistor (the transistor with gate terminal coupled to $WL_n$) has two phase change elements associated therewith. Consequently, one embodiment of the invention contemplates a decoder circuit to vary the biasing of the bit lines $BL_n$ and $BL_{n+1}$ appropriately in order to read both data bits.

Figure 5:
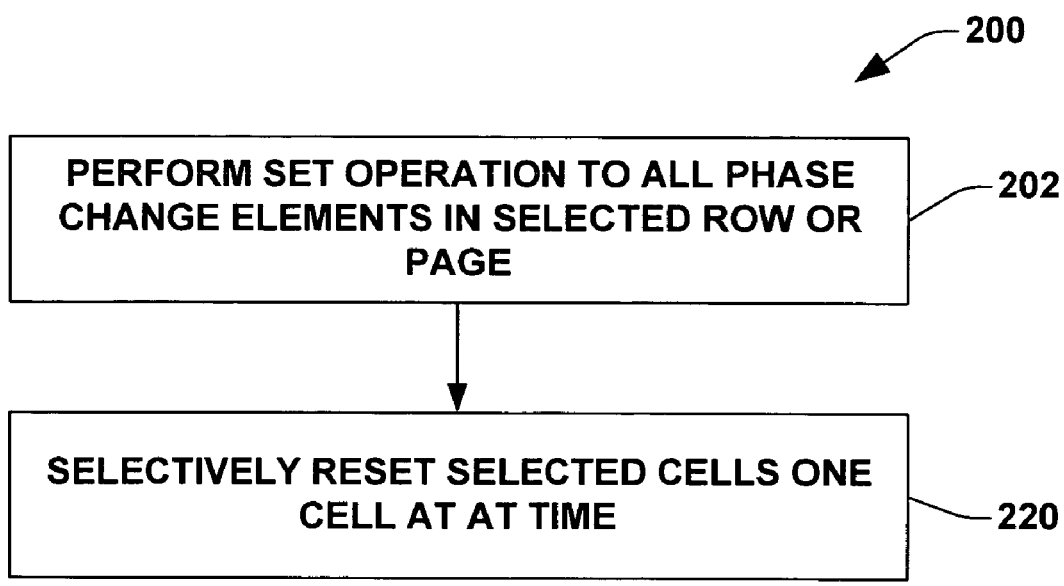
FIG. 5 is a flow chart diagram illustrating a method of addressing a pseudo virtual ground phase change memory array in a write context according to still another embodiment of the invention.

According to another embodiment of the invention, a method of addressing the pseudo virtual ground phase change memory of FIG. 2 is provided, as illustrated in FIG. 5 at reference numeral 200. The method 200 includes writing data to the page or row of memory cells, for example, the page of memory illustrated in FIG. 2. At 202, a SET operation is performed on all the phase change elements in the selected row or page. One manner in which such a SET operation may be performed is illustrated in FIGS. 6 and 7, respectively.

Figure 6:
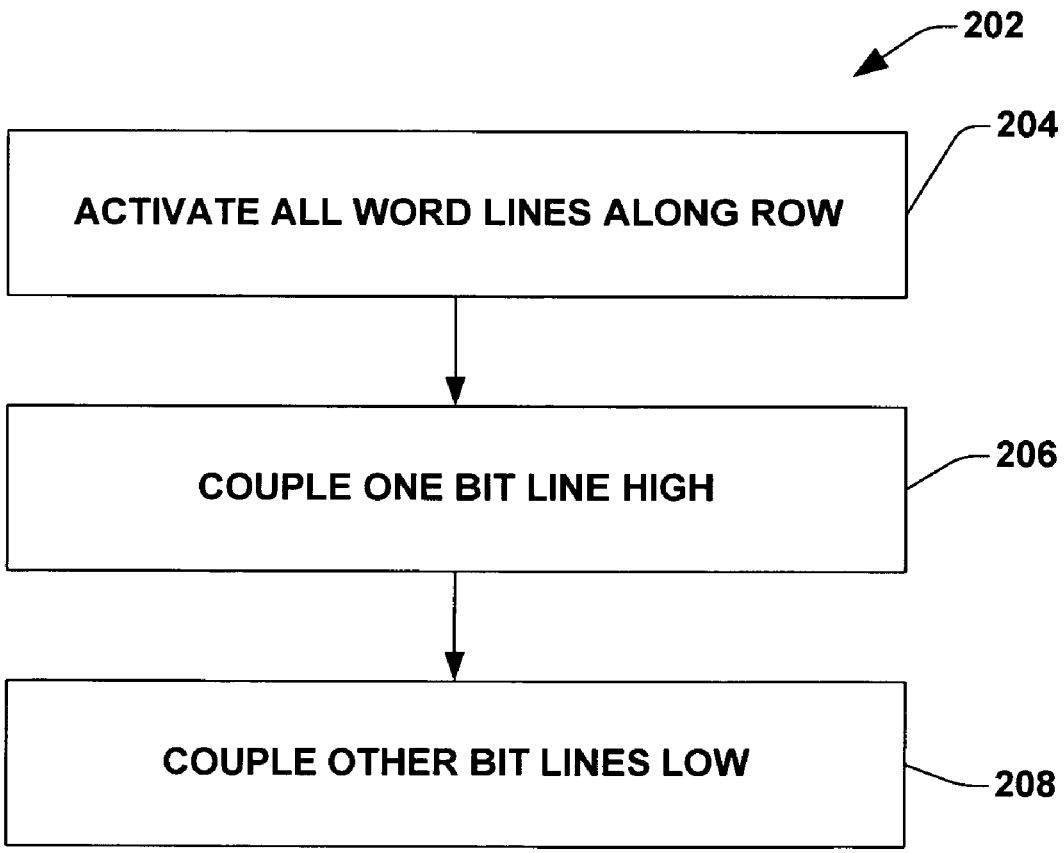
FIG. 6 is a flow chart diagram illustrating a method of setting a row or page of phase change memory cells in a pseudo virtual ground array architecture according to another embodiment of the invention.
Figure 7:
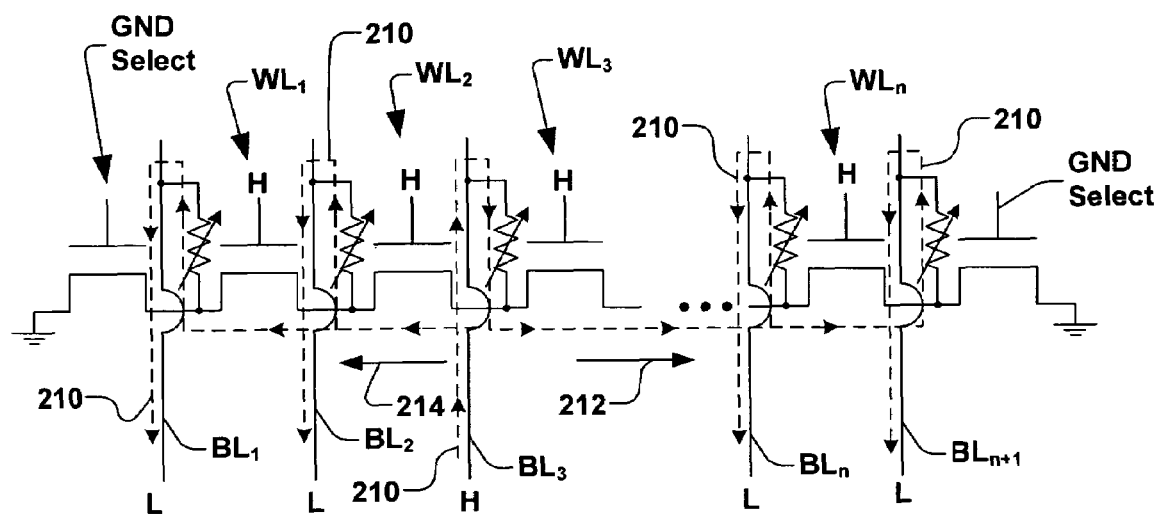
FIG. 7 is a schematic diagram illustrating current flow through a row or page of phase change memory cells in a pseudo virtual ground array architecture in a SET operation according to still another embodiment of the invention.

Referring to FIG. 6, the SET operation, in one embodiment, comprises activating all the word lines along the row, for example, by pulling each MOS select transistor gate terminal associated with the row high. One of the bit lines along the row then is coupled to a high potential (H) at 206, while the other bit lines along the row are coupled to a low potential (L) at 208, while the ground select transistors are turned off. Such a circuit condition is illustrated in FIG. 7. As can be seen in FIG. 7, with each word line pulled high (H), a current path 210 exists that starts at $BL_3$ (the one bit line that is pulled high), and passes through the phase change element associated therewith. Further, the current path 210 extends in both directions 212 and 214 along the MOS select transistor string and into each of the other bit lines because each of the other bit lines (e.g., $BL_1$, $BL_2$, $BL_n$, and $BL_{n+1}$) are pulled low (L). Consequently, the phase change elements associated with each of these bit lines have the SET current 210 pass therethrough. The SET current causes the phase change material to crystallize, forming a low resistance, polycrystalline state in each of the phase change elements along the entire row.

Figure 8:
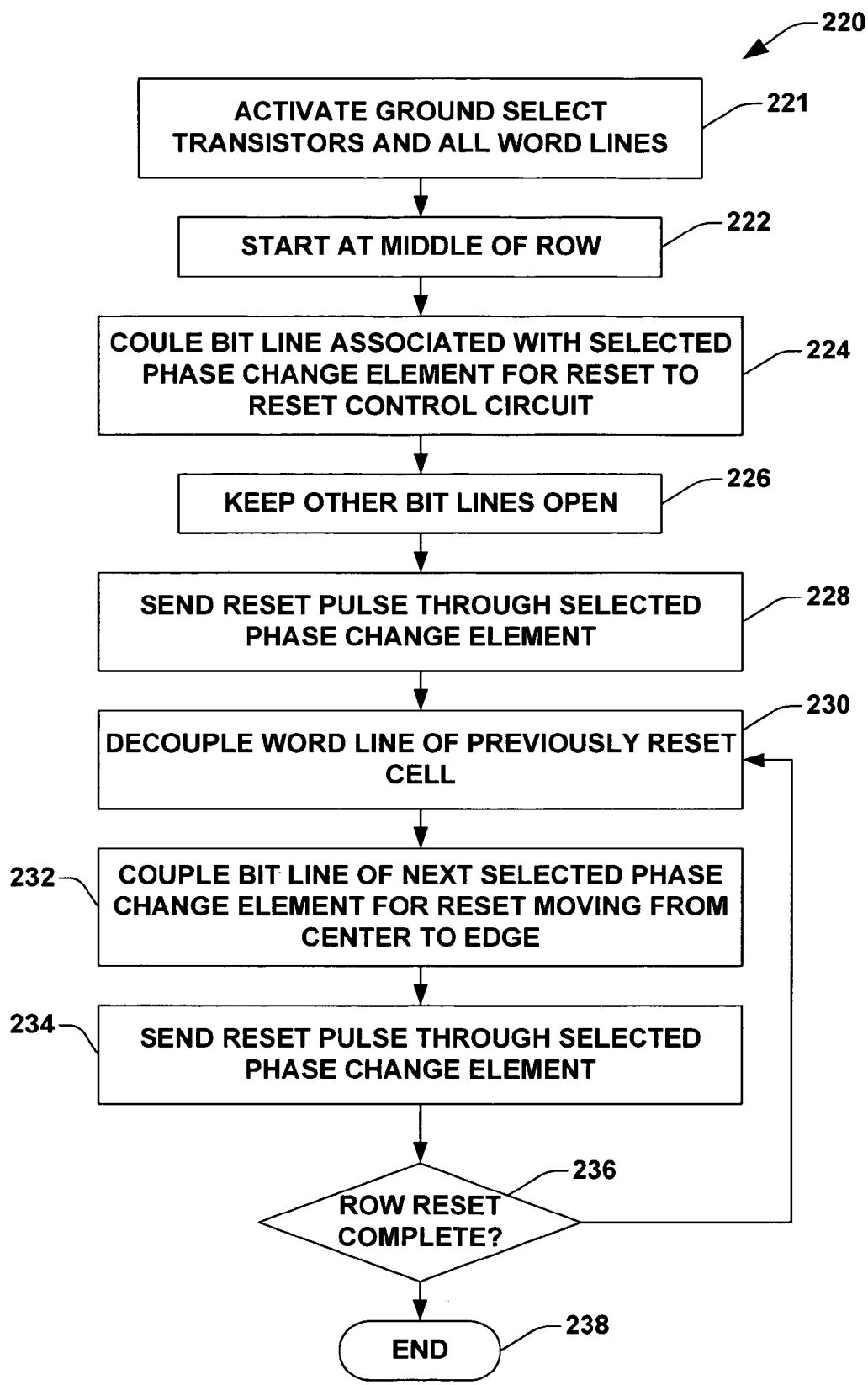
FIG. 8 is a flow chart diagram illustrating a method of resetting one or more selected phase change memory elements along a row or page of phase change memory in a pseudo virtual ground array architecture according to yet another embodiment of the invention.
Figure 9:
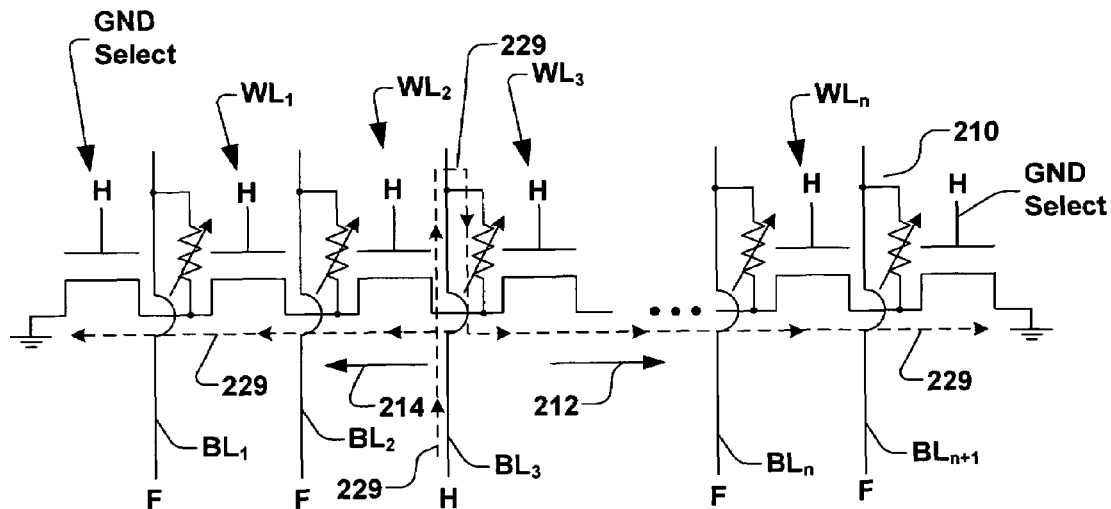
FIGS. 9 and 10 are schematic diagrams illustrating biasing and current flow conditions for a first and subsequent example RESET operations, respectively, for selected phase change memory elements in a row or page of cells configured in a pseudo virtual ground array architecture according to another embodiment of the invention.

Returning now to FIG. 5, the method 200 of addressing the phase change memory continues at 220, wherein selected cells in the row are RESET (i.e., writing a different data bit thereto). One example embodiment of such a RESET procedure is illustrated in FIG. 8. Initially, the ground select transistors at the end of the MOS transistor string are activated or turned on at 221, thereby coupling each end of the transistor string to a ground potential. From a schematic point of view such a bias condition is illustrated in FIG. 9, wherein the ground select transistors behave as activated switches. As will be fully appreciated infra, the procedure 220 starts, in one example, at a middle portion of the selected row at 222 (e.g., $BL_{n+1}/2$), and the bit line associated with the phase change element in the row midpoint is selected by coupling such bit line to a reset control circuit (not shown) at 224. The bit lines associated with non-selected phase change elements are left open or floating (F) at 226. A RESET pulse is then transmitted through the selected phase change element along the selected bit line at 228. The RESET pulse is of sufficient magnitude to cause a melting of the phase change material. The falling edge of the pulse is short enough to cause the melted material to quickly cool or quench, thereby achieving a RESET state, wherein the phase change material is in a relatively high resistance, amorphous state.

As can be seen in FIG. 9, with all non-selected bit lines (all bit lines except $BL_3$) floating (F), and the ground select transistors activated (gates coupled to high (H) potential), the reset current 229 passes through the selected bit line, the selected phase change element, and the activated MOS select transistors (e.g., in both directions 212 and 214) to ground, without impacting other non-selected phase change elements. In the above manner, each phase change element can be individually reset. In the above example, both ground select transistors are activated, wherein the current from the RESET pulse is distributed along directions 212 and 214 along the transistor string, however, in another example, only one of the ground select transistors may be activated, in which case all the RESET pulse current is conducted therethrough and thus in only one direction along the string.

Figure 10:
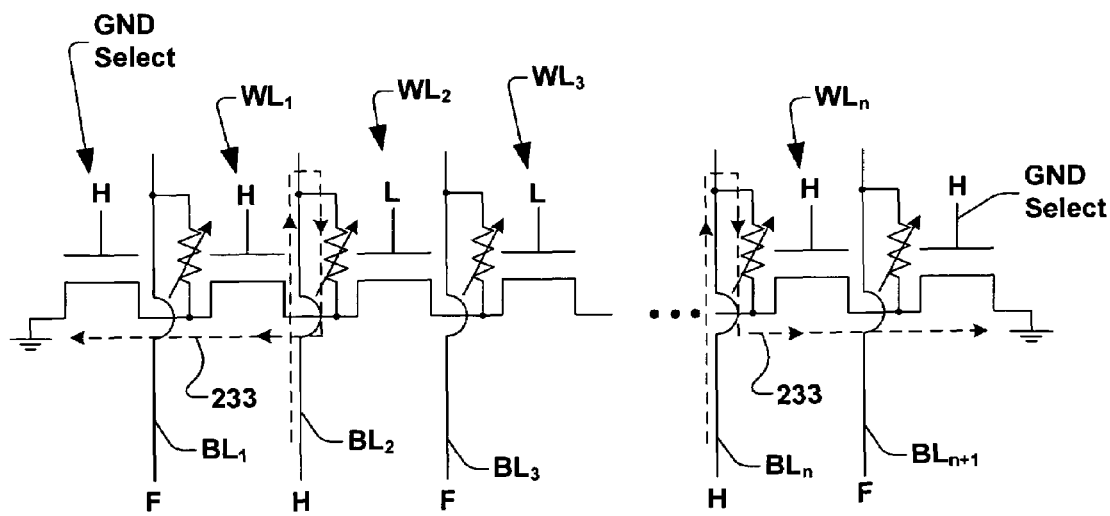

Still referring to FIG. 8, the word line associated with the previously selected phase change element is decoupled from the high potential and either pulled low or left to float at 230. The bit line associated with the next selected phase change element closest to the middle to the reset control circuit is selected at 232. In this instance, only the word lines between that cell and the closest edge (ground select transistor) need be coupled high. Concurrently, in an alternative embodiment the next closest selected cell (i.e., selected for RESET) to the previously selected cell on the opposite side (of the middle of the row) may similarly be selected, in which case the word lines between that selected cell and its respective edge of the row are activated, and the associated selected bit line is pulled high. The other bit lines remain floating. The RESET pulse current 233 is sent through the selected bit line(s) and through the respective phase change element(s) at 234. The RESET current 233 associated with resetting phase change elements $PC_2$ and $PC_n$ is illustrated in FIG. 10.

Still referring to FIG. 8, a query is performed at 236 to determine whether all selected cells have been reset. If the answer to the query is negative (NO at 236), then the RESET method 220 returns to 230, and the appropriate biasing for the next selected cell is performed for RESET thereof. Alternatively, if the answer to the query is positive (YES at 236), the RESET procedure ends at 238.

In accordance with yet another embodiment of the invention, a content-dependent write operation is contemplated. For example, in a situation where the number of cells to be RESET associated with a given page or row of memory is greater than a number cells to be SET, a bit may be toggled associated with such row or page to indicate an inversion of data when read therefrom. For example, if the number of phase change elements associated with a page of memory is 100, and the number of cells to be placed into a RESET state is greater than 50 (e.g., 75), a content-dependent write operation may be employed according to one embodiment of the invention. Since the RESET of such cells is performed one cell at a time, it will be more efficient to instead perform a RESET operation to the 25 phase change elements of such page that were not to be RESET, and then noting that the data in such row is inverted by toggling an "inversion bit" associated therewith. Subsequently, when the page is to be read, the state of the inversion bit is noted, and read operations are performed in accordance with the procedure highlighted above, and after data is retrieved, the resultant data word is then inverted to obtain the actual data.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An integrated circuit comprising:
    a select transistor having a gate coupled to a word line, and a source and drain region coupled between first and second bit lines, respectively, and a body region coupled to a potential that forms a reverse bias voltage between the source and body region;
    a first resistivity changing material element coupled between the first bit line and the source region of the select transistor, wherein the reverse bias voltage is proportional to a resistance level of the first resistivity changing material element, and wherein a threshold voltage condition of the select transistor is a function of the reverse bias voltage; and
    a sense circuit configured ato ascertain a state of the first resistivity changing material element based on the threshold voltage condition of the select transistor.

2. The integrated circuit of claim 1, further comprising a second resistivity changing material element coupled between the drain region and the second bit line.

3. The integrated circuit of claim 1, wherein the select transistor comprises a MOS select transistor.

4. The integrated circuit of claim 1, wherein the reverse bias voltage has a low level when the first resistivity changing material element is in a crystalline state relative to when the first resistivity changing element is in an amorphous state such that the select transistor has a threshold voltage having a first threshold level when hte first resistivity changing material element is in the crystalline state which is less than a second threshold level when the first resistivity changing material element is in the amorphous state, and wherein the sense circuit is configured to ascertain the state of the first resistivity changing material element by determining a level of conduction through the select trnsistor when a read voltage having a level between the first and second threshold levels is applied to the gate.

5. The integrated circuit of claim 4, wherein the sense circuit is configured to determine a level of conduction of the select transistor by comparing a source-to-drain current of the select transistor to a threshold value.

6. A phase change memory array, comprisisng:
   a plurality of select transistors coupled together in series to form a transistor string, wherein each tansistor in the transistor string comprises a gate coupled to a unique word line;
   a plurality of phase change elements, wherein each phase change element is coupled between a unique bit line and a source region of a respective select transistor in the transisor string;
   a grounding transistor serially coupled between each respective end of the transistor string and a ground potential, wherein each grounding transistor is configured to selectively couple a respective end of the transistor string to the ground potential; and
   a control circuit configured to selectively activate the grounding transistors during a reset operation, thereby coupling each end of the reansistor string to the ground potential. and concurrently tie a bit line associated with a cell to be reset to a logic high potential and float all the other bit lines along the transistor string during the reset operation.

7. A phase change memory array, comprising:
   a plurality of select transistors coupled together in series to form a transistor string, wherein each transistor in the transistor string comprises a gate coupled to a unique word line;
   a plurality of phase change elements, wherein each phase change element is cooooooupled between a unique bit line and a source region of a respective select transistor string; and
   a control circuit configured to reactivate all the word lines along the transistor string during a set operation, while concurrently coupling one bit line along the transistor string to a logic high potential and couple the other bit lines along the transistor string to a logic low potential.

8. A method of addressing a phase change memory array configured in a pseudo virtual ground architecture, the phase change memory array including a plurality of MOS select transistors coupled together in series to form a transistor string, wherein each transistor in the transistor string comprises a gate coupled to a unique word line, and a plurality of resistivity changing material elements, wherein each resistivity changing material element is coupled between a unique bit line and a source region of a respective select transistor in the transistor string, the method comprising:
   coupling a body region of each select transistor to a potential that forms a reverse bias voltae between the source and body region, wherein the reverse bias voltage;
   applying a logic low potential to a bit line associated with a source region of the MOS select transistor associated with selected cell in the array to be readl
   applying a logic high potential to a bit line associated with a drain region of the MOS select transistor associated with the selected cell;
   applying a read voltage to a gate region of the MOS select transistor associated with the selected cell; and
   reading a logic state of the selected cell in the aray by evaluating the threshold voltage condition of the select transistor associated therewith.

9. The method of claim 8, wherein the reverse bias voltage has a low level when the first resistivity changing material element is in a crystalline state relative to when the first resistivity changing material element is in a crystalline state relative to when the first resistivity changing element is in an amorphour state such that the MOS select transistor has a threshold voltage having a first threshold level when the first resistivity changing material element is in the crystalline state which is less than a second threshold level when the first resistivity changing material in the amorphous state, and wherein the method further comprises;
   applying a read voltage having a level between the first and second threshold levels is applied to the gate; and
   ascertaining the state of the first resistivity changing material element by determining a level of conduction through the MOS select transistor in response to the applied read voltage.

10. The method of claim 9, wherein determining the level of conduction includes comparing a source-to-drain current of the MOS select transistor to a threshold value.

11. A method of addressing a phase change memory array configured in a pseudo virtual ground architecture, comprising a plurality of MOS select trasistors coupled together in series to form a transistor string, wherein each transistor in the tansistor string comprises a gate coupled to a unique word line, and a plurality of phase change elements, wherein each phase change element is coupled between a unique bit line and a source region of a respective MOS select transistor in the transistor string, the method comprisisng performing a write operation to a selected cell in the aray, comprising:
   performing a set operation to all phase change elements along the transistor string; and
   selectively performing a reset operation to the eslected cell along the transistor string, wherein performing the reset operation to the selected cell comprises:
   coupling one end of the transistor string to a low potential;
   coupling a bit line associated with the selected cell to a high potential;
   activating each of the MOS select transistors in the transistor string between the selected cell and the end of the transistor string coupled to the low potential; and
   floating all other bit lines associated with the activated MOS select transistors, wherein a current flow between the high potential bit line and low potential at the end of the transistor string is operable to alter a state of the phase change element of the selected cell to a second state.

12. The method of claim 11, wherein performing the set operation to all the phase change elements along the transistor string comprises:
   activating each of the MOS select transistors in the transistor string;
   coupling one bit line associated with the transistor string to a high potential; and
   coupling all other bit lines associated with the transistor string to a low potential, wherein bit line-to-bit line current causes each phase change element associated with the transistor string to achieve a first state.

13. The method of claim 11, wherein performing the set operation to all the phase change elements along the transistor string is performed one word at a time, wherein a word comprises the cells associated with a bit line pair, comprising:
   (a) activating a MOS select transistor associated with a selected word to be set;
   (b) de-activating the other MOS select transistors of the transistor string; and
   (c) coupling a first bit line associated with the word to a high potential, and coupling a second bit line associated with the word to a low potential, wherein the bit line-to-bit line current causes each phase change element associated with selected word to achieve a first state.

14. The method of claim 13, further comprising repeating acts (a), (b), and (c) for each word along the transistor string until all the phase change elements associated therewith are in the first state.

15. A method of addressing a phase change memory array configured in a pseudo virtual ground architecture, comprising a plurality of MOS select transistors coupled together in series to form a transistor string, wherein each transistor in the transistor string comprises a gate coupled to a unique word line, and a plurality of phase change elements, wherein each phase change element is coupled between a unique bit line and a source region of a respective MOS select transistor in the transistor string, the method comprising performing a write operation to a selected cell in the array, comprising:
   perfoming a set operation to all phase change elements along the transistor string; and
   selectively performing a reset operation to the selected cell along the transistor string, wherein performing the reset operation to the selected cell further comprises performing the reset operation to a plurality of cells along the transistor string, comprising:
   (a) identifying one selected cell of the plurality of selected cells for reset to a center of the transistor string;
   (b) coupling each end of the transistor string to a low potential;
   (c) activating each of the MOS select transistors along the transistor string;
   (d) applying a reset condition to a bit line associated with the identified cell; and
   (e) floating the other bit lines, wherein the reset condition causes a reset current to flow through the phase change element of the identified cell, thereby changing a state thereof from a first state to a second state.

16. The method of claim 15, further comprising:
   (f) identifying another selected cell next closest to the center of the transistor string; and
   (g) repeating acts (b), (c), (d) and (e) to change the state of the another selected cell to the second state.

17. The method of claim 16, further comprising repeating acts (I) and (g) until all of the plurality of selected cells for reset are changed to the second state.

18. A method of addressing a phase change memory array configured in a pseudo virtual ground architecture, comprising a plurality of MOS select transistors coupled together in series to form a transistor string, wherein each transistor in the transistor string comprises a gate coupled to a unique word line, and a plurality of phase chang elements, wherein each phase change element is coupled between a unique bit line and a source region of a respective MOS select transistor in the transistor string, the method comprising performing a write operation to a selected cell in the array, comprising:
   performing a set operation to all phase change elements along the transistor string,
   determining a number of selected cells to be reset along the transistor string; and
   replacing the selective reset operation with an inverted reset operation if the number of selected cells to be reset is greater than a predetermined threshold.

19. The method of claim 18, wherein the inverted reset operation comprises:
   performing a reset operation on all non-selected cells for reset along the transistor string; and
   providing an indication of the inverted reset operation for a subsequent reading of the cells along the transistor string.

\* \* \* \* \*